United States Patent

Choi et al.

[11] Patent Number: 6,063,676
[45] Date of Patent: May 16, 2000

[54] MOSFET WITH RAISED SOURCE AND DRAIN REGIONS

[75] Inventors: Jeong Yeol Choi, Palo Alto; Chung-Chyung Han; Ken-Chuen Mui, both of San Jose, all of Calif.

[73] Assignee: Integrated Device Technology, Inc., Santa Clara, Calif.

[21] Appl. No.: 08/871,139

[22] Filed: Jun. 9, 1997

[51] Int. Cl.[7] ................................................ H01L 21/336
[52] U.S. Cl. ........................................... 438/299; 438/300
[58] Field of Search ...................................... 438/300, 230

[56] References Cited

U.S. PATENT DOCUMENTS

| | | | |
|---|---|---|---|
| 4,016,587 | 4/1977 | De La Moneda | 357/23 |
| 4,072,545 | 2/1978 | De La Moneda | 148/187 |
| 4,841,347 | 6/1989 | Hsu . | |
| 4,849,369 | 7/1989 | Jeuch et al. . | |
| 5,168,072 | 12/1992 | Moslehi . | |
| 5,182,619 | 1/1993 | Pfiester . | |
| 5,242,847 | 9/1993 | Ozturk et al. . | |
| 5,340,758 | 8/1994 | Wei et al. | 437/40 |
| 5,371,026 | 12/1994 | Hayden et al. | 437/41 |
| 5,376,578 | 12/1994 | Hsu et al. | 437/56 |
| 5,418,173 | 5/1995 | Lee et al. . | |
| 5,504,031 | 4/1996 | Hsu et al. | 437/57 |
| 5,654,240 | 8/1997 | Lee et al. . | |
| 5,683,924 | 11/1997 | Chan et al. . | |
| 5,691,212 | 11/1997 | Tsai et al. . | |
| 5,736,419 | 4/1998 | Naem | 437/44 |
| 5,773,358 | 6/1998 | Wu et al. . | |
| 5,777,920 | 7/1998 | Ishigaki et al. | 365/154 |
| 5,804,472 | 9/1998 | Balasinski et al. | 438/152 |

*Primary Examiner*—John F. Niebling
*Assistant Examiner*—Jonathan Hack
*Attorney, Agent, or Firm*—Skjerven, Morrill, MacPherson, Franklin & Friel

[57] ABSTRACT

A semiconductor substrate having a surface, a field oxide region at the surface and a gate structure above the surface are provided. A sidewall spacer is formed adjacent to the gate structure and a polysilicon layer is formed above the substrate, the polysilicon layer having raised first and second portions above the gate structure and field oxide region, respectively. A masking layer is formed above the polysilicon layer and then blanket etched to expose the raised first and second portions of the polysilicon layer which are subsequently removed to form a raised source/drain region from the polysilicon layer. Since the raised source/drain region is fabricated without using photolithography, high density MOSFETs are readily fabricated.

9 Claims, 5 Drawing Sheets

MOSFET WITH RAISED SOURCE AND DRAIN REGIONS

BACKGROUND OF THE INVENTION

1. Field of the Invention

The present invention relates in general to integrated semiconductor devices and more particularly to the fabrication of metal oxide semiconductor field effect transistors with raised source and drain regions and the resulting structure.

2. Description of the Prior Art

As metal oxide semiconductor field effect transistors (MOSFETs) are scaled down to have feature sizes below 0.5 microns ($\mu$m), several device characteristics become increasingly important.

One important characteristic is the punchthrough voltage between the source and drain, i.e. the source/drain voltage at which conduction between the source and drain (punchthrough) occurs when the gate is biased below (above) the threshold voltage for N-channel (P-channel) MOSFETs. Punchthrough occurs as a result of a drain depletion layer extending from the drain into the channel. One conventional method of preventing punchthrough is to form the MOSFET with a channel length (distance between the source and drain) sufficient to prevent the drain depletion layer from extending across the channel. However, it is desirable to reduce the channel length to reduce the substrate surface area occupied by the MOSFET thereby allowing higher density devices to be fabricated.

One conventional method of reducing the channel length while maintaining sufficient punchthrough protection is to reduce the junction depth of the source/drain in the substrate. De La Moneda, U.S. Pat. No. 4,016,587 (hereinafter De La Moneda), teaches a raised source and drain IGFET device having shallow source/drain junctions in the substrate. Referring to FIG. 1i of De La Moneda, a raised source protrusion 13 and drain protrusion 15 are illustrated. Also shown in FIG. 1i are source junctions 17 and 22 and drain junctions 19 and 24 formed in a silicon wafer 2.

After formation of source protrusion 13, drain protrusion 15 and the respective junctions 17, 22 and 19, 24, an oxide layer 34 is grown over all the exposed silicon surfaces to insure that gate 9, source protrusion 13 and drain protrusion 15 are electrically isolated from field shields 7 and 11 and from each other. However, during the thermal cycle in which oxide layer 34 is grown, junctions 17, 22 and 19, 24 are driven substantially deeper into substrate 2. This excessive dopant diffusion undesirably degrades punchthrough protection. Further, the method taught by De La Moneda is complex and requires numerous fabrication steps. Yet, it is desirable to reduce the number of fabrication steps and to simplify the process used to produce the MOSFET.

Another conventional method of reducing the junction depth of the source/drain in the substrate is to grow a selective epitaxial layer and dope this selective epitaxial layer to form elevated source and drain regions as taught by Hsu et al. (Hsu), U.S. Pat. No. 5,504,031. Referring to Hsu FIG. 12, a selective epitaxial layer is grown and doped to form n-channel elevated source/drain regions 34 extending from sidewalls 22 to field oxide regions 12 and p-channel elevated source/drain regions 40 extending from sidewalls 26 to field oxide regions 12. However, the present inventors have discovered that faceting of the selective epitaxial layer unpredictably increases the junction depth of the source/drain in the substrate.

Present FIG. 1 is a cross-sectional view a portion of a MOSFET having a selective epitaxial layer illustrating the problem of faceting. Referring to FIG. 1, during growth of epitaxial layer 10, a growth plane 12 (growth along a different crystallographic plane than the principal surface of the epitaxial layer) is formed where epitaxial layer 10 meets sidewall spacer 14. The formation of growth plane 12 is well known to those skilled in the art and is commonly referred to as faceting. As a result of faceting, epitaxial layer 10 is thinner where epitaxial layer 10 meets sidewall spacer 14. Implanted impurities readily pass through this thinner portion of epitaxial layer 10 into substrate 16 compared to the thicker portions of epitaxial layer 10. Thus, the junction depth of the source/drain in the substrate is greatest near the channel (and sidewall spacer 14) which degrades punchthrough protection. Accordingly, it is desirable to have a method of forming a MOSFET which does not use a selective epitaxial layer growth technique.

Another important device characteristic is the threshold voltage, i.e. the voltage applied to the conductive gate layer at which the channel between the source and drain becomes conductive. Among other things, the threshold voltage is determined in part by the source/drain voltage (the voltage between the source and drain). However, it is desirable to minimize variations in the threshold voltage from variations in the source/drain voltage, i.e. to control the conduction of the channel by the voltage applied to the conductive gate layer independent of the source/drain voltage.

One conventional method of reducing the effect on threshold voltage of the source/drain voltage is to reduce the junction depth of the source/drain in the substrate. However, as discussed above, conventional techniques provide only a limited reduction in the junction depth of the source/drain in the substrate.

Other obstacles in scaling down MOSFETs to feature sizes below 0.5 $\mu$m are the limitations in conventional photolithographic masking techniques and particularly the inability to precisely pattern the mask, i.e. the tolerance associated with positioning the mask. To accommodate photolithographic masking tolerance of each masking step, the feature size of the MOSFET must be increased to insure reliability of the MOSFET which limits reduction in feature size. Accordingly, it is desirable to fabricate MOSFETs using the fewest number of photolithographic masking steps to reduce feature size.

The art needs a method of fabricating MOSFETs with a junction depth of the source/drain in the substrate which is sufficiently shallow to provide adequate punchthrough protection and threshold voltage control in MOSFETs with reduced feature size. Further, the method should minimize the number of photolithographic masking steps used, to allow further reductions in feature size.

SUMMARY OF THE INVENTION

In accordance with the present invention, a method of fabricating a MOSFET includes providing a semiconductor substrate having a principal surface, a field oxide region at the substrate principal surface and a gate structure overlying the substrate principal surface. A sidewall spacer is formed adjacent a side of the gate structure and then a polysilicon layer is formed overlying the substrate. The polysilicon layer has a raised first portion overlying the gate structure and a raised second portion overlying the field oxide region. A masking layer is then formed overlying the polysilicon layer and blanket etched to expose the raised first portion and the raised second portion of the polysilicon layer. The raised first portion and the raised second portion of the polysilicon layer are then removed. A remaining third portion of the polysilicon layer defines an electrically conductive raised source/drain region (i.e., an electrically conductive structure) overlying the substrate principal surface and extending laterally from the sidewall spacer to the field oxide region of the MOSFET.

Of importance, the electrically conductive raised source/drain region is fabricated without using photolithography to pattern a masking layer. This allows the gate structure to be patterned at the minimum dimension obtainable using photolithographic techniques, i.e. at the critical dimension. This enables the feature size of a MOSFET in accordance with the present invention to be reduced compared to the prior art.

In accordance with the present invention a MOSFET having electrically conductive raised source/drain regions (i.e. electrically conductive structures) overlying the substrate principal surface and shallow source/drain junctions includes a semiconductor substrate having a principal surface, a field oxide region at the substrate principal surface and a gate structure overlying the substrate principal surface. Adjacent a side of the gate structure is a sidewall spacer. Overlying the substrate principal surface is the electrically conductive raised source/drain region extending from the sidewall spacer to the field oxide region. The electrically conductive raised source/drain region has a first portion on a part of the field oxide region, a second portion on a part of the sidewall spacer and a third portion on the substrate principal surface. The electrically conductive raised source/drain region has a substantially uniform thickness.

The MOSFET in some embodiments further includes a shallow first semiconductor region having a first conductivity type in the substrate and a shallow second semiconductor region having the first conductivity type in the first semiconductor region. The first semiconductor region is laterally aligned with the side of the gate structure and laterally extends to the field oxide region. The second semiconductor region is laterally aligned with the sidewall spacer and laterally extends to the field oxide region.

By forming shallow source/drain junctions in the substrate, the drain depletion layer between the source and drain of the MOSFET is suppressed which advantageously increases the source/drain voltage at which punchthrough occurs compared to the prior art. This allows the width of the gate structure to be reduced thereby allowing high density MOSFETs to be fabricated. Forming shallow source/drain junctions in the substrate also reduces the effect on threshold voltage of the source/drain voltage.

These and other objects, features and advantages of the present invention will be more readily apparent from the detailed description of the preferred embodiments set forth below taken in conjunction with the accompanying drawings.

DETAILED DESCRIPTION OF THE PREFERRED EMBODIMENTS

Figure 1:
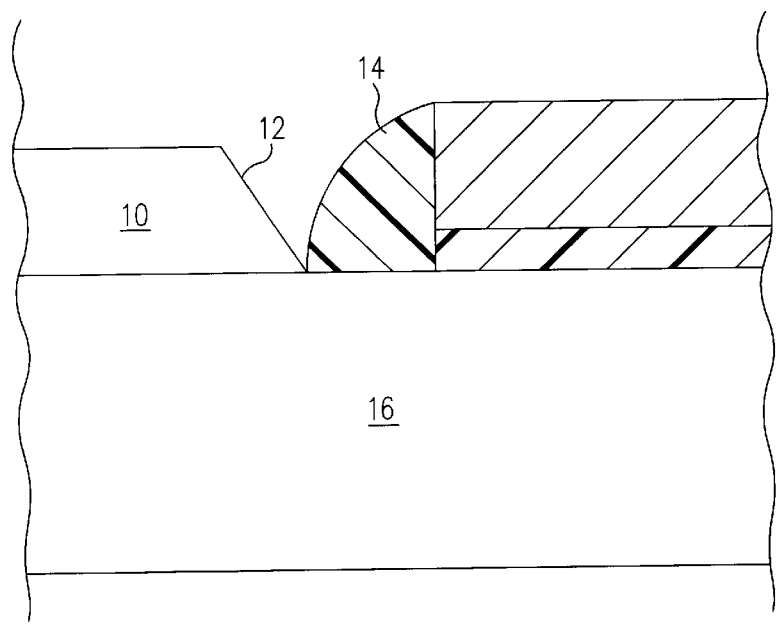
FIG. 1 is cross-sectional view of a portion of a MOSFET having a selective epitaxial layer illustrating the problem of faceting.
Figure 2:
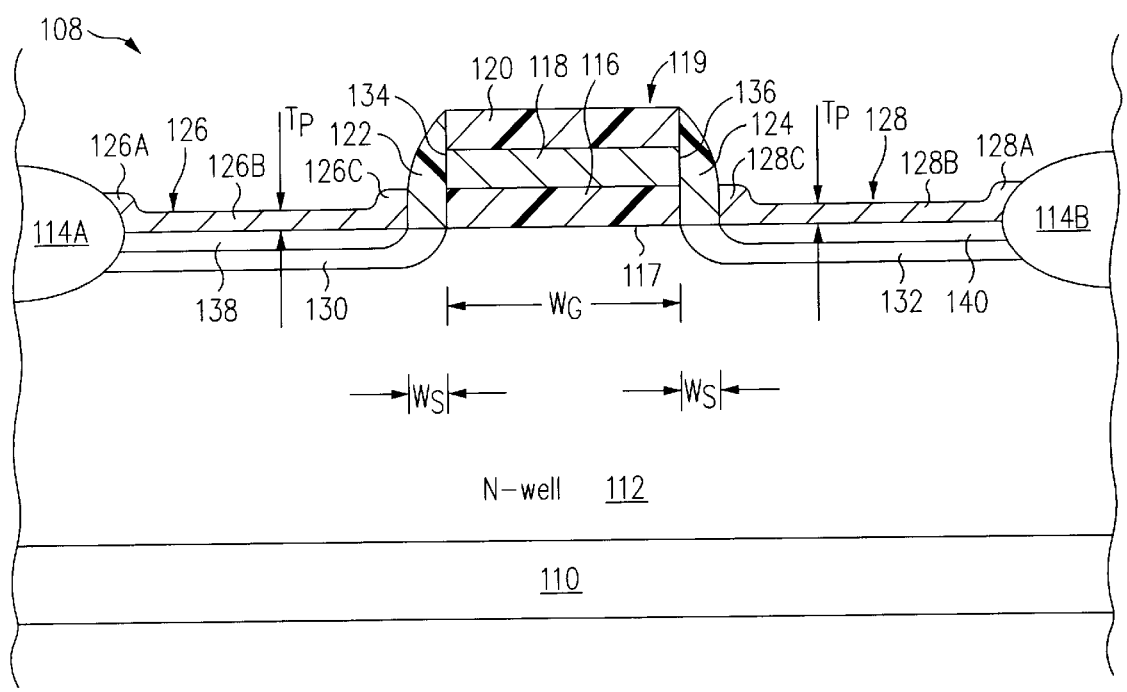
FIG. 2 is a cross-sectional view of a MOSFET in accordance with the present invention.

FIG. 2 is a cross-sectional view of a MOSFET 108 in accordance with the present invention. A conventional N-well 112 is formed in a substrate 110. Formed at the principal surface 117 of substrate 110 are conventional field oxide regions 114A and 114B.

A conventional gate structure 119 of MOSFET 108 includes a gate oxide layer 116, an electrically conductive gate layer 118, and a second oxide layer 120. As shown in FIG. 2, gate oxide layer 116 overlies substrate principal surface 117, gate layer 118 overlies gate oxide layer 116 and second oxide layer 120 overlies gate layer 118. Formed adjacent sides 134, 136 of the gate structure 119 are conventional sidewall spacers 122, 124, respectively.

Overlying substrate principal surface 117 is an electrically conductive raised source/drain region 126 (i.e. an electrically conductive structure) extending laterally from sidewall spacer 122 to field oxide region 114A. Raised source/drain region 126 includes a first portion 126A formed on a portion of field oxide region 114A, a second portion 126B formed on a portion of substrate principal surface 117 and a third portion 126C formed on a portion of sidewall spacer 122. First, second and third portions 126A, 126B, 126C are all of a substantially uniform (e.g. no greater than 10% variation) thickness $T_p$. Illustratively, thickness $T_p$ is in the range of 1000 Å to 5000 Å.

Similarly, overlying substrate principal surface 117 is an electrically conductive raised source/drain region 128 (i.e. an electrically conductive structure) extending laterally from sidewall spacer 124 to field oxide region 114B. Raised source/drain region 128 includes a first portion 128A formed on a portion of field oxide region 114B, a second portion 128B formed on a portion of substrate principal surface 117 and a third portion 128C formed on a portion of sidewall spacer 124. First, second and third portions 128A, 128B, 128C are also of a substantially uniform thickness $T_p$.

Formed in substrate 110, and in particular in N-well 112, are shallow (in terms of depth) and lightly doped P− source/drain junctions 130, 132 (hereinafter P− junctions 130, 132). Illustratively, P− junctions 130, 132 have dopant concentrations in the range of $1 \times 10^{17}$ atoms/cm$^3$ to $1 \times 10^{19}$ atoms/cm$^3$ and depths (from substrate principal surface 117) in the range of 0.05 μm to 0.3 μm. As shown in FIG. 2, P− junctions 130, 132 (i.e. the source/drain regions) are laterally aligned with sides 134, 136 of gate structure 119 and laterally extend to field oxide regions 114A, 114B, respectively.

Formed within substrate 110, and more particularly within P− junctions 130, 132, are shallow and heavily doped P+ source/drain junctions 138, 140 (hereinafter P+ junctions 138, 140), respectively. Illustratively, P+ junctions 138, 140 have dopant concentrations in the range of $1 \times 10^{19}$ atoms/cm$^3$ to $1 \times 10^{21}$ atoms/cm$^3$ and depths (from substrate principal surface 117) in the range of 0.01 μm to 0.2 μm. As shown in FIG. 2, P+ junctions 138, 140 (i.e. the source/drain contact regions) are laterally aligned with sidewall spacers 122, 124 and laterally extend to field oxide regions 114A, 114B, respectively.

Raised source/drain region 126 is in physical and electrical contact with P+ junction 138 and is in electrical contact (via P+ junction 138) with P− junction 130. As such, raised source/drain region 126, P+ junction 138 and P− junction 130 collectively are referred to as a first source/drain of MOSFET 108. Similarly, raised source/drain region 128 is in physical and electrical contact with P+ junction 140 and is in electrical contact (via P+ junction 140) with P− junction 132. As such, raised source/drain region 128, P+ junction 140 and P− junction 132 are collectively referred to as a second source/drain of MOSFET 108. (In a transistor of this type, the source and drain are similar in structure.)

Forming shallow P− junctions 130, 132 and shallow P+ junctions 138, 140 advantageously suppresses the vertical component of the drain depletion layer and thus suppresses the drain depletion layer. Suppressing the drain depletion layer advantageously enhances punchthrough protection (increases the source/drain voltage at which punchthrough occurs). This allows the width $W_G$ of gate structure 119, i.e. the distance between sides 134 and 136 of gate structure 119, to be reduced (e.g. by 10% to 20%) compared to the prior art. Accordingly, the surface area of substrate 110 occupied by MOSFET 108 is reduced allowing higher density devices to be fabricated.

Forming shallow P− junctions 130, 132 and shallow P+ junctions 138, 140 also reduces the effect on threshold voltage of the source/drain voltage. This is because shallow source/drain junctions reduce or eliminate the portion of the channel at the channel edge which is controlled by the source/drain voltage. Accordingly, the source/drain voltage has a reduced effect on the threshold voltage, i.e. the threshold voltage is substantially independent of the source/drain voltage. Illustratively, threshold voltage variations from source/drain voltage is less than or equal to 50 mv (100 mv) for 0.5 μm (0.3 μm) technology.

Figure 3:
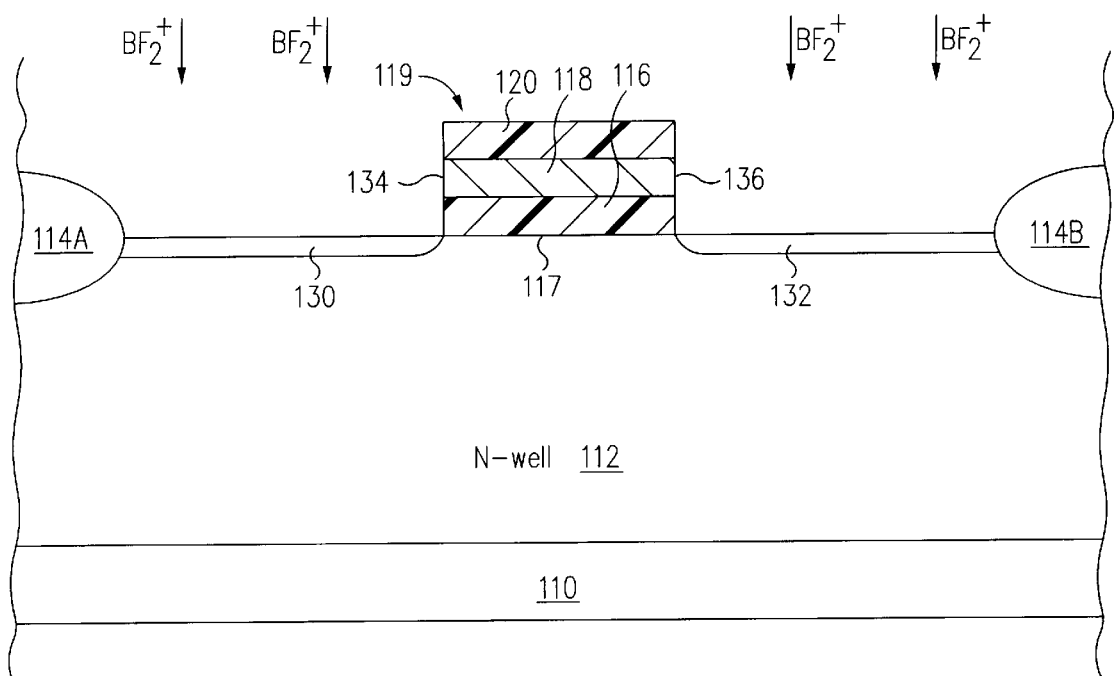
FIG. 3 is a cross-sectional view of the MOSFET of FIG. 2 during fabrication in accordance with the present invention.

Elements in the various figures which are substantially similar are designated by similar reference numbers. FIG. 3 is a cross-sectional view of the MOSFET of FIG. 2 during fabrication in accordance with the present invention. As shown in FIG. 3, N-well 112 is formed in substrate 110, typically a silicon substrate, using conventional techniques. At substrate principal surface 117, field oxide regions 114A, 114B (silicon oxide, $SiO_x$) are formed using conventional techniques, for example a LOCOS technique or shallow trench with oxide fill. Illustratively, field oxide regions 114A, 114B have thicknesses in the range of 2000 Å to 5000 Å. Although a separately doped N-well 112 is illustrated in FIG. 3, a separately doped well region does not have to be formed. For example, instead of forming a separately doped N-well 112, substrate 110 can be an N type substrate. Further, in an alternative embodiment, field oxide regions 114A, 114B are formed before N-well 112 is formed using techniques well known to those skilled in the art.

A gate structure 119 is then formed overlying substrate principal surface 117 using conventional techniques. Gate structure 119 includes gate oxide layer 116, gate layer 118 and second oxide layer 120. Gate oxide layer 116 is typically a thermally grown or chemical vapor deposition (CVD) oxide layer (silicon oxide) but can be formed of other electrically insulating materials. Gate layer 118 is typically formed of heavily doped polycrystalline silicon ("polysilicon") but can be formed of other electrically conductive materials. Further, gate layer 118 can be one or more layers of electrically conductive material. For example, when gate layer 118 is a polycide layer, it includes a doped polysilicon layer with an overlying metal silicide layer such as tungsten silicide, molybdenum silicide or titanium silicide. Second oxide layer 120 is typically a CVD oxide layer (silicon oxide) but can also be formed of other electrically insulating materials such as silicon nitride ($Si_3N_4$). Illustratively, thicknesses for gate oxide layer 116, gate layer 118, and second oxide layer 120 are in the range of 30 Å to 200 Å, 1000 Å to 5000 Å, and 1000 Å to 5000 Å, respectively.

As shown in FIG. 3, the entire structure is then subjected to a P type impurity implantation, illustrated as $BF_2^+$, to form P− junctions 130, 132 in N-well 112. The P type impurity is implanted with an energy insufficient to pass the P type impurity through gate structure 119 or field oxide regions 114A, 114B and into the underlying portions of substrate 110. For example, boron fluoride ions ($BF_2^+$) are implanted using an implant energy in the range of 10 kev to 100 kev and an implant dosage in the range of $1 \times 10^{12}$ atoms/cm$^2$ to $1 \times 10^{14}$ atoms/cm$^2$. Since the P type impurity does not pass through gate structure 119, field oxide regions 114A, 114B and into the underlying portions of substrate 110, P− junctions 130, 132 are self aligned (laterally aligned) to sides 134, 136 of gate structure 119 and laterally extend to field oxide regions 114A, 114B, respectively.

Figure 4A:
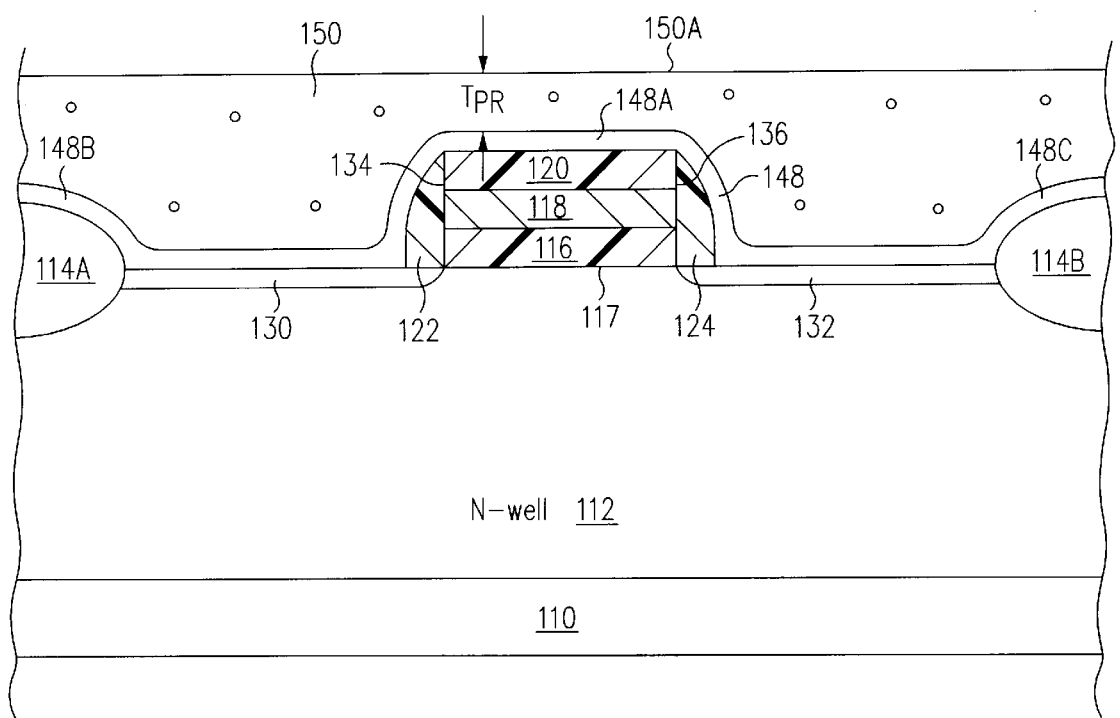
FIG. 4A is a cross-sectional view of the MOSFET of FIG. 2 further along in fabrication in accordance with one embodiment of the present invention.

FIG. 4A is a cross-sectional view of the MOSFET of FIG. 2 further along in processing in accordance with one embodiment of the present invention. As shown in FIG. 4A, sidewall spacers 122, 124 are formed adjacent sides 134, 136 of gate structure 119, respectively, using conventional techniques. Sidewall spacers 122, 124 are an electrically insulating material, for example silicon oxide.

After sidewall spacers 122, 124 are formed, a layer 148, e.g. polysilicon, is formed overlying the entire structure. Although layer 148 is illustrated as a single layer, layer 148 can be one or more layers of material. For example, in the case when layer 148 is a polycide layer, then layer 148 includes a polysilicon layer and an overlying metal silicide layer.

As shown in FIG. 4A, polysilicon layer 148 follows the topography of the underlying structure. After polysilicon layer 148 is formed, a masking layer 150, e.g. photoresist, is formed overlying the entire structure. Although masking layer 150 is typically photoresist, other materials besides photoresist can be used. In general, it is desirable to have a material which can be preferentially etched compared to polysilicon layer 148, i.e. a material which can be readily removed without significantly removing polysilicon (or any other material which forms polysilicon layer 148). Of importance, masking layer 150 has a substantially planar surface 150A which is substantially parallel to the plane defined by substrate principal surface 117. As an illustration, a conventional spin-on photoresist would have a substantially planar surface 150A, i.e. would have a surface 150A which does not follow the topography of the underlying structure. Further, as shown in FIG. 4A, masking layer 150 has a thickness $T_{PR}$ over first portion 148A of polysilicon layer 148. Typically, thickness $T_{PR}$ is 1,000 angstroms or more, although it is only necessary to have a thickness $T_{PR}$ which is sufficient to allow the photoresist (or other material) to flow to produce planar surface 150A.

Figure 4B:
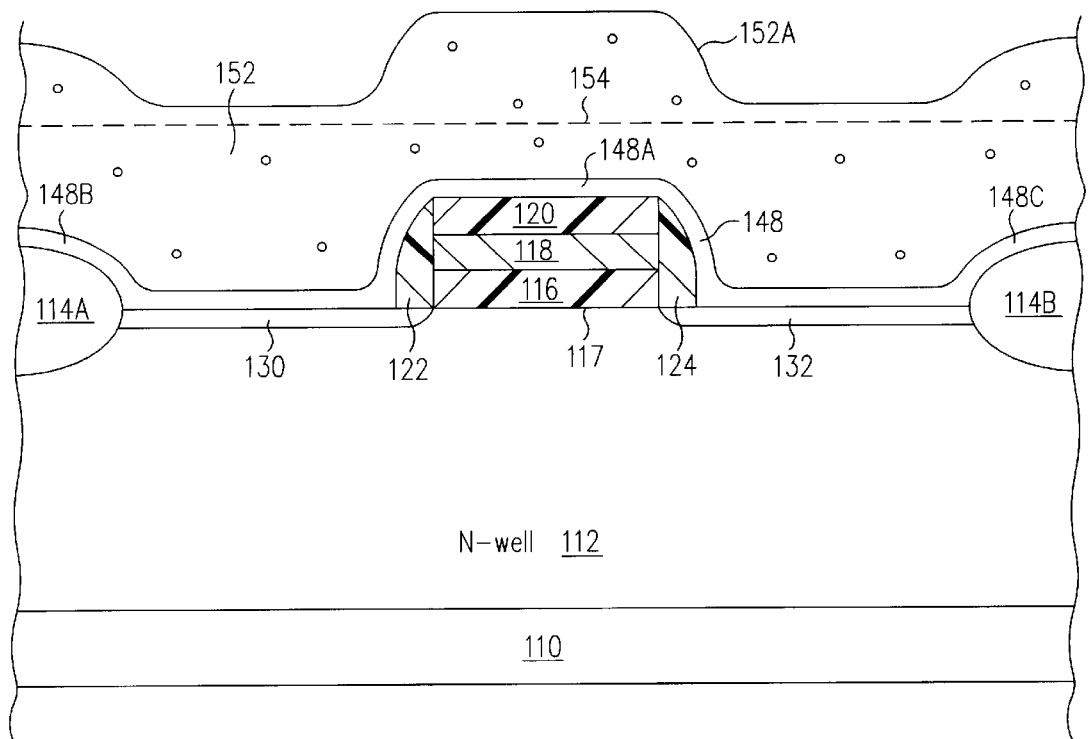
FIG. 4B is a cross-sectional view of the MOSFET of FIG. 2 further along in fabrication in accordance with an alternative embodiment of the present invention.

FIG. 4B is a cross-sectional view of the MOSFET of FIG. 2 further along in processing in accordance with an alternative embodiment of the present invention. In this embodiment, after sidewall spacers 122, 124 and polysilicon layer 148 are formed, another masking layer 152 which etches preferentially to polysilicon layer 148 is formed. For example, masking layer 152 is silicon nitride, boron phosphosilicate glass (BPSG), or phosphosilicate glass (PSG). As shown in FIG. 4B, the upper surface 152A of masking layer 152 approximately follows the topography of the underlying structure. After masking layer 152 is formed, the structure is chemically-mechanically polished (planarized) during which upper surface 152A is ground down to be a substantially planar surface, indicated by the dashed line 154, which is substantially parallel to the plane defined by substrate principal surface 117.

Figure 5:
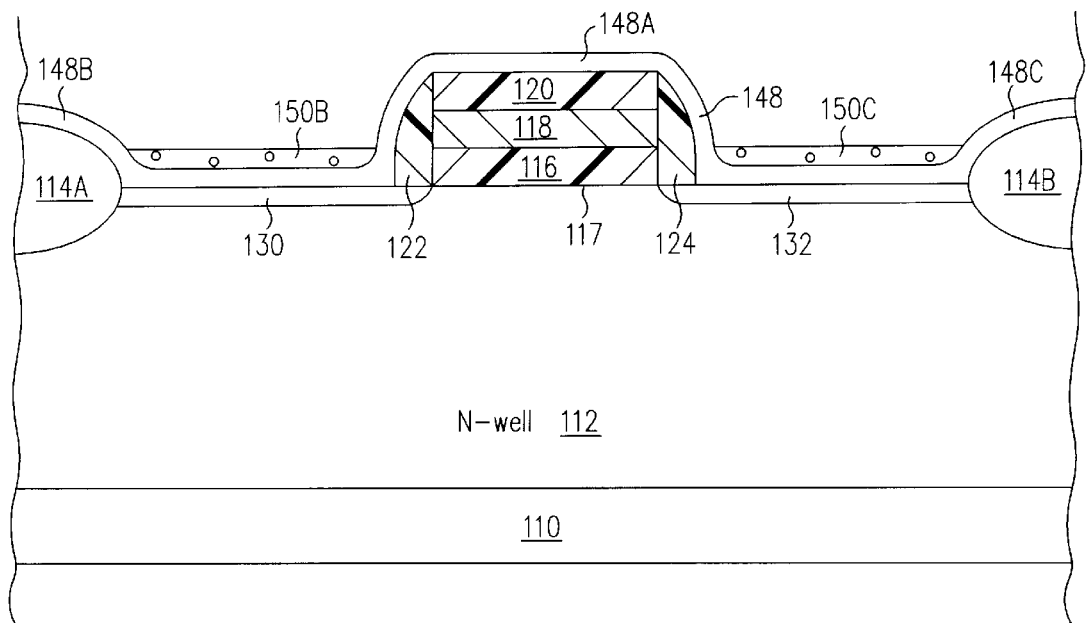
FIGS. 5 and 6 are cross-sectional views of the MOSFET of FIG. 2 at various stages further along in fabrication in accordance with the FIG. 4A embodiment of the present invention.

FIG. 5 is a cross-sectional view of the MOSFET of FIG. 2 further along in processing in accordance with the FIG. 4A embodiment of the invention. As shown in FIG. 5, masking layer 150 (FIG. 4A) is blanket etched (etched uniformly) to leave remaining first and second portions 150B, 150C of masking layer 150. When masking layer 150 is photoresist, masking layer 150 can be blanket etched using a conventional ashing technique (ashing involves oxidation of the photoresist). As shown in FIG. 5, portions 150B, 150C of masking layer 150 leave exposed first, second and third portions 148A, 148B and 148C of polysilicon layer 148.

Figure 6:
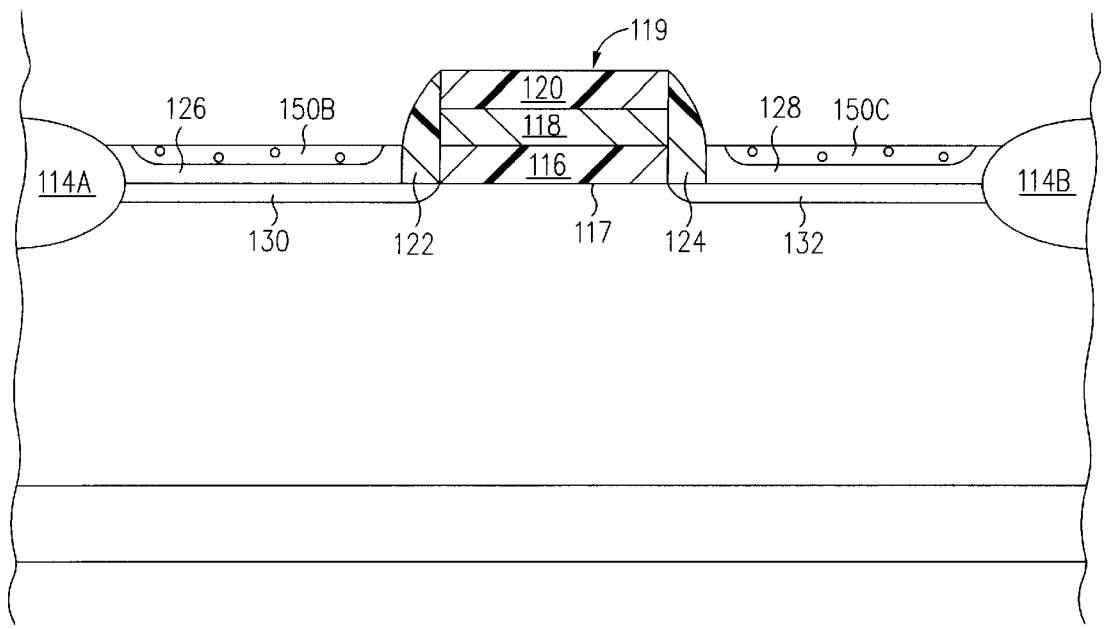

As shown in FIG. 6, the exposed first, second and third portions 148A, 148B, and 148C of polysilicon layer 148 (FIG. 5) are removed using portion 150B, 150C of masking layer 150 as a mask. Since second oxide layer 120 and sidewall spacers 122, 124 are formed of materials (e.g. silicon oxide) having etch selectivity to polysilicon layer 148, significant etching of gate structure 119 is prevented. The remaining portions (those which underlie portions 150B, 150C of masking layer 150) of polysilicon layer 148 define raised source/drain regions 126, 128.

FIGS. 5, 6 are in accordance with the embodiment illustrated in FIG. 4A, i.e. using masking layer 150. However, it is understood that a similar process is used to form portions (similar to portions 150B, 150C of masking layer 150, see FIGS. 5, 6) of masking layer 152 in the embodiment of FIG. 4B. In the case where masking layer 152 is silicon nitride, a suitable etchant for the blanket etch of masking layer 152 is phosphoric acid.

Figure 7:
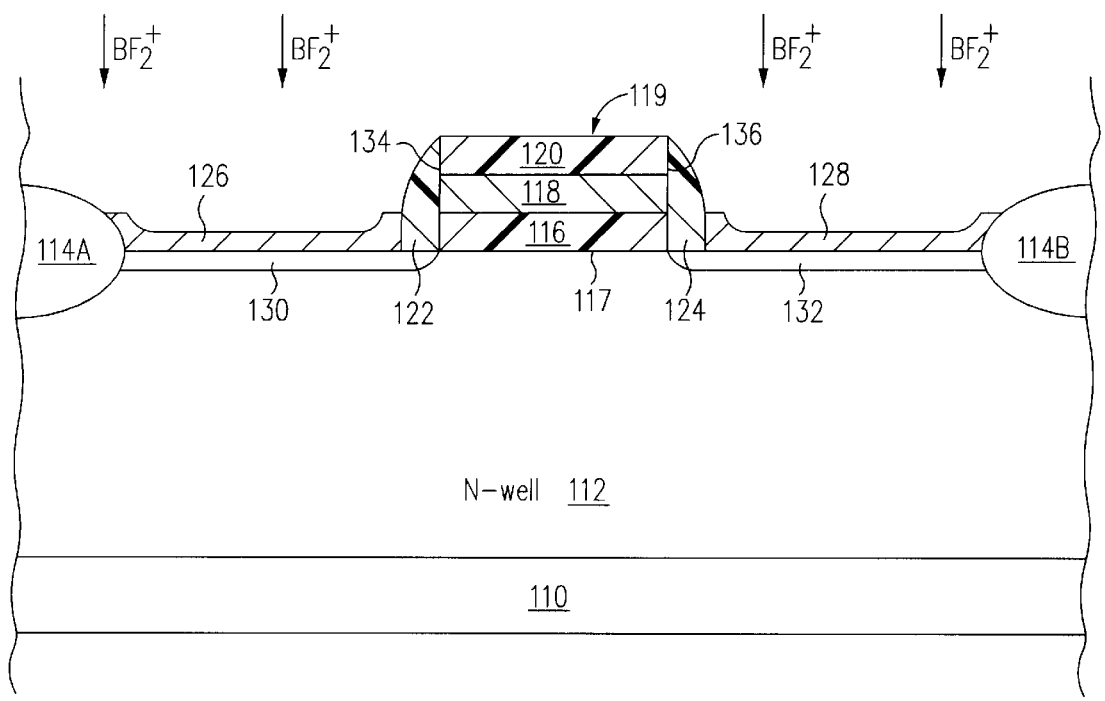
FIGS. 7, 8, and 9 are cross-sectional views of the MOSFET of FIG. 2 at various stages further along in fabrication in accordance with the present invention.

As shown in FIG. 7, the remaining portions 150B, 150C of masking layer 150 (or the remaining portions of masking layer 152) are removed. The structure is then subjected to a P type impurity implantation, again illustrated as $BF_2^+$. For example, $BF_2^+$ is implanted at an implant energy of 60 kev and an implant dosage in the range of $1 \times 10^{15}$ atoms/cm$^2$ to $5 \times 10^{15}$ atoms/cm$^2$. The P type impurity does not pass through field oxide regions 114A, 114B, gate structure 119 or through sidewall spacers 122, 124 and into the underlying portions of substrate 110. The P type impurity does enter into raised source/drain regions 126, 128 and thereby dopes them to have P type conductivity.

In an alternative embodiment, instead of doping raised source/drain regions 126, 128 as illustrated in FIG. 7, the P type impurity is implanted into these portions of polysilicon layer 148 (FIGS. 4A, 4B) before polysilicon layer 148 is etched to define raised source/drain regions 126, 128. Referring to FIG. 4A (FIG. 4B), in this alternative embodiment, after polysilicon layer 148 is formed and before masking layer 150 (masking layer 152) is formed, the structure is subjected to a P type impurity implantation. The P type impurity implanted, the implant energy and the implant dosage are similar to those described in reference to FIG. 7. The P type impurity dopes polysilicon layer 148 to have P type conductivity. After the P type impurity is implanted into polysilicon layer 148, then masking layer 150 (masking layer 152) is formed and processing continues as described above.

Regardless of whether raised source/drain regions 126, 128 are doped before patterning (FIGS. 4A, 4B) or after patterning (FIG. 7), the structure is heated to a sufficient temperature and for a sufficient duration to drive some of the P type impurities in raised source/drain regions 126, 128 into the underlying portions of substrate 110. As an illustration, the structure is heated to a temperature in the range of 800° C. to 950° C. for 1.0 hour. Alternatively, a conventional rapid thermal anneal is performed, illustratively, to heat the substrate to a temperature in the range of 900° C. to 1000° C. for 20 to 30 seconds.

Referring again to FIG. 2, during the thermal cycle, the P type impurities diffuse from raised source/drain regions 126, 128 into substrate 110 to form P+ junctions 138, 140 in P− junctions 130, 132, respectively. (This thermal cycle also drives P− junctions 130, 132 laterally to extend slightly under gate structure 119). During this thermal cycle the P type impurities also diffuse throughout raised source/drain regions 126, 128. This results in the structure illustrated in FIG. 2.

In accordance with another embodiment of the present invention, P− junctions 130, 132 and P+ junctions 138, 140 are formed without performing the P type impurity implantation illustrated in FIG. 3. Accordingly, this embodiment is similar to the embodiments illustrated in FIGS. 3, 4A, 4B, 5, 6, and 7 except that P− junctions 130, 132 would not be illustrated in the figures in this embodiment. Referring now to FIG. 7, in this alternative embodiment, the P type impurity implantation illustrated in FIG. 7 is performed to implant P type impurities into raised source/drain regions 126, 128. After the P type impurities are implanted into raised source/drain regions 126, 128, a thermal cycle is performed during which the P type impurities diffuse throughout the raised source/drain regions 126, 128 as described above. However, in accordance with this embodiment, some of the P type impurities also diffuse into substrate 110, in particular into N-well 112, to form P− junctions 130, 132 and P+ junctions 138, 140 (FIG. 2) simultaneously. This results in the structure illustrated in FIG. 2. P+ junctions 138, 140 are formed because the P type impurity concentration is higher near the source of the P type impurities, namely near raised source/drain regions 126, 128. P− junctions 130, 132 are formed because the P type impurity concentration diminishes as the distance from raised source/drain regions 126, 128 increases.

The thermal cycle time and temperature are selected so that the P type impurities diffuse laterally to extend slightly under gate structure 119, i.e. P− junctions 130, 132 are laterally aligned with sides 134, 136 of gate structure 119, respectively. In accordance with this embodiment, the width $W_s$ (FIG. 2) of sidewall spacers 122, 124 is of increased importance. In particular, it is important to accurately control width Ws so that the lateral distance over which the P type impurities diffuse through substrate 110 from raised source/drain regions 126, 128 to sides 134, 136 of gate structure 119, respectively, is also accurately controlled. Accurately controlling the lateral distance over which the P type impurities diffuse allows the thermal cycle time and temperature to be selected with precision. (Too long or hot of a thermal cycle results in excessive dopant diffusion whereas too short or cool of a thermal cycle does not drive the P type impurities to gate structure 119.) Illustratively, width $W_s$ is in the range of 500 Å to 2000 Å.

Of further importance, the thickness $T_p$ of raised source/drain regions 126, 128 should be accurately controlled, e.g. to have variations no greater than ±10%. Thickness $T_p$ should be accurately controlled since the P type impurities pass through raised source/drain regions 126, 128 to reach substrate principal surface 117. Thus, variations in thickness $T_p$ results in variations in the amount of P type impurities which diffuse to substrate principal surface 117 for a given thermal cycle.

For convenience, the thermal cycle is described above as being performed after polysilicon layer 148 is patterned to form raised source/drain regions 126, 128 (see FIG. 7). However, the thermal cycle can be performed during any stage of fabrication after the P type impurity is implanted into polysilicon layer 148 or portions thereof. For example in the case where the P type impurity is implanted into polysilicon layer 148 before patterning (FIGS. 4A, 4B), the thermal cycle can be performed to form P+ junctions 138, 140 (and P– junctions 130, 132 depending upon the embodiment) before masking layer 150 (masking layer 152) is formed.

Figure 8:
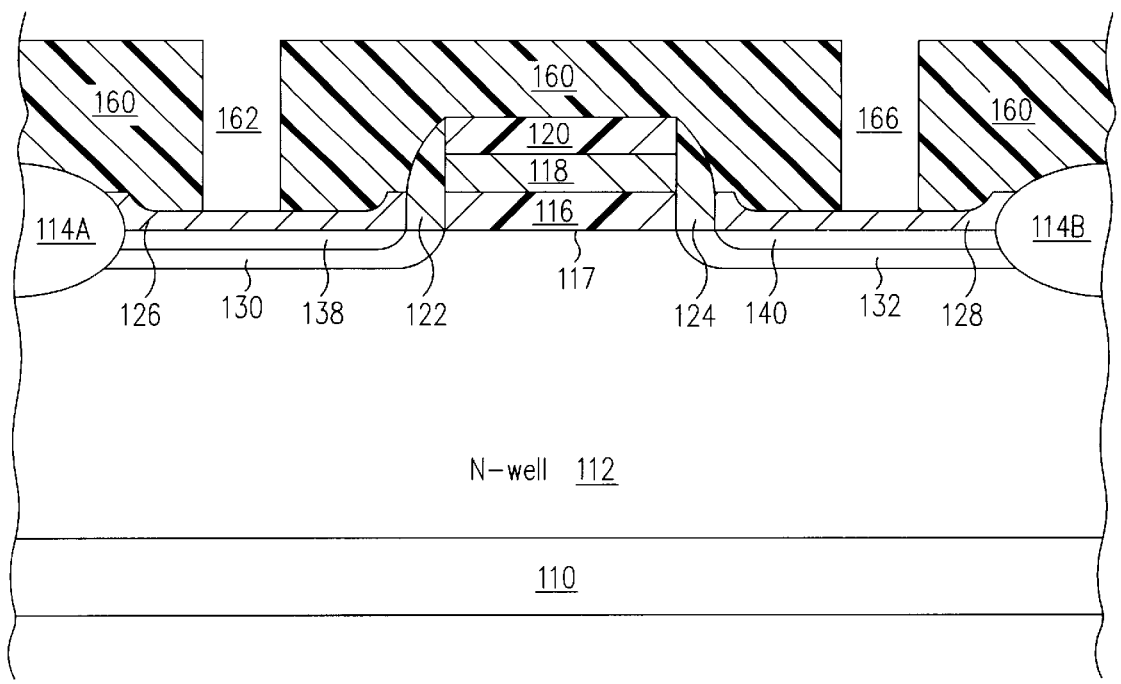

FIG. 8 is a cross-sectional view of the MOSFET of FIG. 2 further along in processing in accordance with the present invention. As shown in FIG. 8, an insulating layer 160, typically silicon oxide or silicon nitride, is formed overlying the entire structure and patterned using conventional techniques. Apertures 162, 166 extend through insulating layer 160 to expose portions of raised source/drain regions 126, 128, respectively.

Figure 9:
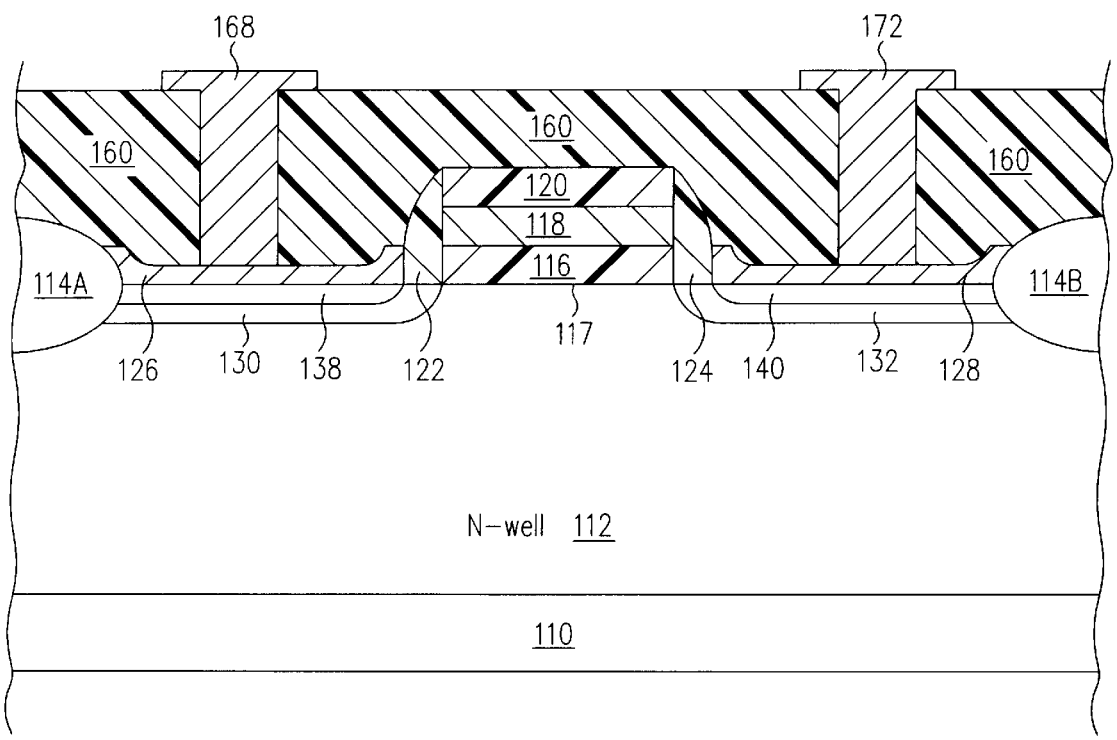

FIG. 9 is a cross-sectional view of the MOSFET of FIG. 2 further along in processing in accordance with the present invention. After apertures 162, 166 (FIG. 8) are formed in insulating layer 160, source/drain contacts 168, 172 are formed from an electrically conductive material (e.g. aluminum) using conventional techniques. As shown in FIG. 9, source/drain contacts 168, 172 extend through apertures 162, 166 and are in electrical contact with raised source/drain regions 126, 128, respectively. Raised source/drain regions 126, 128 serve as lateral extensions of source/drain contacts 168, 172, respectively. The gate contact (not shown) is typically fabricated simultaneous with source/drain contacts 168, 172.

Referring to FIGS. 4A, 4B, 5, 6, and 7, raised source/drain regions 126, 128 are fabricated without using complex photolithographic techniques, i.e. without using photolithography to pattern a masking layer. of importance, this allows gate structure 119 to be patterned at the critical dimension (the minimum dimension obtainable using photolithographic techniques). If raised source/drain regions 126, 128 were patterned using photolithographic techniques, then gate structure 119 would have to be somewhat larger (wider) than the critical dimension to accommodate tolerance in the placement of the mask used to pattern raised source/drain regions 126, 128. To accommodate tolerance in the formation of the gate contact to gate structure 119 while patterning gate structure 119 at the critical dimension over the active areas of the MOSFET, the gate contact is formed outside of the active areas (over field oxide) where gate structure 119 is widened. (Active areas are defined by field oxide, i.e. are areas having an absence of field oxide.) This enables the feature size of a MOSFET in accordance with the present invention to be reduced compared to the prior art.

In the above embodiments, the fabrication of MOSFETs having P type source/drains (PMOS transistors) and the resulting structures is described. It is understood that the conductivity type of the implanted impurities and semiconductor regions can be reversed to form MOSFETs having N type source/drains (NMOS transistors). For example, N-well 112 can be a P-well. The P type impurity implantation illustrated in FIG. 3 can be performed with an N type impurity, for example can be arsenic implanted with an implant energy in the range of 10 kev to 100 kev or greater and an implant dosage in the range of $1 \times 10^{12}$ atoms/cm$^2$ to $1 \times 10^{14}$ atoms/cm$^2$. Further, the P type impurity implantation illustrated in FIG. 7 can be performed with an N type impurity, for example can be arsenic implanted with an implant energy of 60 kev to 80 kev and an implant dosage of $5 \times 10^{15}$ atoms/cm$^2$. Further, it is understood that a PMOS transistor and an NMOS transistor in accordance with the present invention can be formed during the same process in the same substrate, for example to form a complementary metal oxide silicon (CMOS) device.

Having thus described the principles of the invention, together with several illustrative embodiments thereof, it is to be understood that, although specific terms are employed, they are used in a generic and descriptive sense, and not for the purpose of limitation, the scope of the invention being set forth in the following claims.

We claim:

1. A method of forming a semiconductor device comprising the following steps:

providing a semiconductor substrate having a surface, a field oxide region at said surface and a gate structure overlying said surface;

forming a sidewall spacer adjacent to said gate structure;

forming a layer overlying said substrate, said layer having a raised first portion overlying said gate structure and a raised second portion overlying said field oxide region;

forming a masking layer overlying said layer, said masking layer having a substantially planar exposed surface;

blanket etching said masking layer to expose said raised first portion and said raised second portion of said layer, said masking layer having a remaining portion disposed on said layer;

selectively removing said raised first portion and said raised second portion of said layer using said remaining portion of said masking layer, wherein upon removing said raised first portion and said raised second portion, an electrically conductive structure is provided overlying said surface and extending laterally from said sidewall spacer to said field oxide region;

removing said remaining portion of said masking layer;

implanting impurities having a first conductive type into said electrically conductive structure; and diffusing said impurities into said substrate to form a first semiconductor region wherein said first semiconductor region is laterally aligned with a side of said gate structure and laterally extends to said field oxide region.

2. The method of claim 1 wherein during said step of diffusing, said impurities diffuse into said substrate to form a second semiconductor region.

3. The method of claim 2 wherein said first semiconductor region and said second semiconductor region are formed in a third semiconductor region having a second conductivity type opposite said first conductivity type.

4. The method of claim 1 wherein said first conductivity type is P type.

5. The method of claim 1 further comprising the steps of:

forming an insulating layer overlying said substrate;

forming an aperture in said insulating layer; and forming a source/drain contact in said aperture wherein said source/drain contact is electrically connected to said electrically conductive structure.

6. The method of claim 1 wherein said layer comprises polycrystalline silicon.

7. The method of claim 1 wherein said layer comprises polycide.

8. The method of claim 1 wherein during said step of blanket etching, said masking layer is preferentially etched relative to said layer.

9. A method of forming a semiconductor device comprising the following steps:

provide a semiconductor substrate having a surface, a field oxide region at said surface and a gate structure overlying said surface;

forming a sidewall spacer adjacent to said gate structure;

forming a layer overlying said substrate, said layer having a raised first portion overlying said gate structure and a raised second portion overlying said field oxide region;

forming a masking layer overlying said layer, said masking layer having a substantially planar exposed surface;

blanket etching said masking layer to expose said raised first portion and said raised second portion of said layer, said masking layer having a remaining portion disposed on said layer;

selectively removing said raised first portion and said raised second portion of said layer using said remaining portion of said masking layer, wherein upon removing said raised first portion and said raised second portion, an electrically conductive structure is provided overlying said surface;

removing said remaining portion of said masking layer;

implanting impurities having a first conductive type into said electrically conductive structure; and diffusing said impurities into said substrate to form a first semiconductor region.

\* \* \* \* \*